US012314572B2

(12) United States Patent
Thucanakkenpalayam Sundararajan (10) Patent No.: US 12,314,572 B2
(45) Date of Patent: May 27, 2025

(54) CONFLICT DETECTION AND ADDRESS ARBITRATION FOR ROUTING SCATTER AND GATHER TRANSACTIONS FOR A MEMORY BANK

(71) Applicant: Synopsys, Inc., Mountain View, CA (US)

(72) Inventor: Karthik Thucanakkenpalayam Sundararajan, Fremont, CA (US)

(73) Assignee: Synopsys, Inc., Sunnyvale, CA (US)

( * ) Notice: Subject to any disclaimer, the term of this patent is extended or adjusted under 35 U.S.C. 154(b) by 214 days.

(21) Appl. No.: 17/962,683

(22) Filed: Oct. 10, 2022

(65) Prior Publication Data

US 2024/0118811 A1  Apr. 11, 2024

(51) Int. Cl.
*G11C 7/00* (2006.01)
*G06F 3/06* (2006.01)
*G11C 7/10* (2006.01)

(52) U.S. Cl.
CPC .......... *G06F 3/0619* (2013.01); *G11C 7/1045* (2013.01); *G11C 7/1078* (2013.01)

(58) Field of Classification Search
CPC ... G06F 3/0619; G06F 13/362; G06F 13/1626
USPC ........................................................ 365/191
See application file for complete search history.

(56) References Cited

U.S. PATENT DOCUMENTS 8,296,526 B2 * 10/2012 O'Brien .............. G06F 13/1652
 711/170
9,292,380 B2 * 3/2016 Singh .................... G06F 12/063

* cited by examiner

*Primary Examiner* — Tha-O H Bui
(74) *Attorney, Agent, or Firm* — Patterson + Sheridan, LLP (57) ABSTRACT

A system and method for mitigating memory transaction conflicts by receiving a first memory transaction from a first processor slice of a processor and a second memory transaction from a second processor slice of the processor. Further, one or more control signals are generated for the first memory transaction and the second memory transaction based on a determination that the first memory transaction and the second memory transaction have a target address associated with a first memory bank of a memory. The first memory transaction is selected to output to the first memory bank based on the one or more control signals.

20 Claims, 4 Drawing Sheets

CONFLICT DETECTION AND ADDRESS ARBITRATION FOR ROUTING SCATTER AND GATHER TRANSACTIONS FOR A MEMORY BANK

TECHNICAL FIELD

The present disclosure generally relates to a processor system. In particular, the present disclosure relates to a system and method for providing conflict detection and address arbitration for routing scatter and gather transactions.

BACKGROUND

A processing system includes a processor having multiple slices or processing elements. The processor is a vector processor having multiple vector slices or vector processing elements. Each of the vector slices or the vector processor executes instructions sets to operate on arrays (e.g., vectors) of data. The vector slices can perform operations in parallel with each other. The operations performed by the vector slices include executing memory transactions (e.g., load instructions or store instructions). The memory transactions are used to read (e.g., load) or write (e.g., store) data to memory banks of a memory.

SUMMARY

In one example, a system includes a memory comprising a first memory bank, a processor, and arbitration circuitry. The processor includes a first processor slice and a second processor slice. The first and second processor slices respectively generate a first memory transaction and a second memory transaction for the first memory bank. The arbitration circuitry is connected to the processor. The arbitration circuitry generates one or more control signals for the first memory transaction and the second memory transaction based on a determination that the first memory transaction and the second memory transaction have a target address associated with the first memory bank. The arbitration circuitry selects the first memory transaction to output to the first memory bank based on the one or more control signals.

In one example, the method includes receiving a first memory transaction from a first processor slice of a processor and a second memory transaction from a second processor slice of the processor. Further, the method includes generating one or more control signals for the first memory transaction and the second memory transaction based on a determination that the first memory transaction and the second memory transaction have a target address associated with a first memory bank of a memory. The method further includes selecting the first memory transaction to output to the first memory bank based on the one or more control signals.

In one example, the arbitration circuitry includes control signal generation circuitry. The control signal generation circuitry receives a first memory transaction from a first processor slice of a processor and a second memory transaction from a second processor slice of the processor. Further the arbitration circuitry generates one or more control signals for the first memory transaction and the second memory transaction based on a determination that the first memory transaction and the second memory transaction have a target address within a memory bank of a memory. The arbitration circuitry further includes selection circuitry that receives the first memory transaction and the second memory transaction. The selection circuitry further selects the first memory transaction to output to the memory bank based the one or more control signals.

BRIEF DESCRIPTION OF THE DRAWINGS

The disclosure will be understood more fully from the detailed description given below and from the accompanying figures of embodiments of the disclosure. The figures are used to provide knowledge and understanding of embodiments of the disclosure and do not limit the scope of the disclosure to these specific embodiments. Furthermore, the figures are not necessarily drawn to scale.

DETAILED DESCRIPTION

Aspects of the present disclosure relate to conflict detection and address arbitration for routing scatter and gather transactions for a memory bank.

In a processing system, arbitration is used to select from among conflicting memory transactions. A processing system includes a processor that has multiple processor slices or processing elements. In one example, the processor is a vector processor, and the processor slices are vector slices. The vector slices execute instructions to operate on a one-dimensional array of data. The processor slices transmit memory transactions to write data to or read data from memory banks of a memory. The processor slices operate during processor cycles. The processor cycles corresponds to a rising or falling edges of a clock signal (or signals) of the processor. During each processing, multiple processor slices may attempt to read data from or write data to the same memory bank. Such memory transactions may be referred to as conflicting memory transactions. To prevent read and/or write errors that may occur due to the conflicting memory transactions, arbitration circuitry is used to select a conflicting memory transaction to transmit to the memory bank. The arbitration circuitry uses the priority of the processor slices to select from among the conflicting memory transactions.

During the arbitration processes performed by the arbitration circuitry, the arbitration circuitry performs memory bank conflict detection to determine whether a conflict exists between the memory transactions of processor slices, and address arbitration to select from the among the conflicting memory transactions. As the circuitry used to perform the memory bank conflict detection spans across (e.g., receives a memory transaction from) all the processor slices, as the number processor slices increases, the size of the circuitry increases and the memory bank conflict detection and the timing of the address arbitration becomes more challenging. Accordingly, as the number of processor slices increases, the frequency of the processor is negatively affected, reducing performance of the corresponding processing system.

The arbitration circuitry as described herein includes multiple rows of multiplexers that are used to detect to perform arbitration of the conflicting memory transactions based on control signals generated from the memory transactions. Control signals for the multiplexers are generated from a vector of the memory transactions that takes into account the memory transaction conflict detection and address arbitration.

Technical advantages of the present disclosure include, but are not limited to, using multiple rows of multiplexers controlled via control signals, which are generated based on memory transaction conflicts and address arbitration, to reduce the circuit size of the arbitration circuitry, and the corresponding processing system, and to reduce the amount of time spent during the arbitration process. Accordingly, the cost of the corresponding processing system is reduced, and the frequency at which the corresponding processor is able to operate is increased as compared to a processing system that employs other arbitration circuitries.

Figure 1:
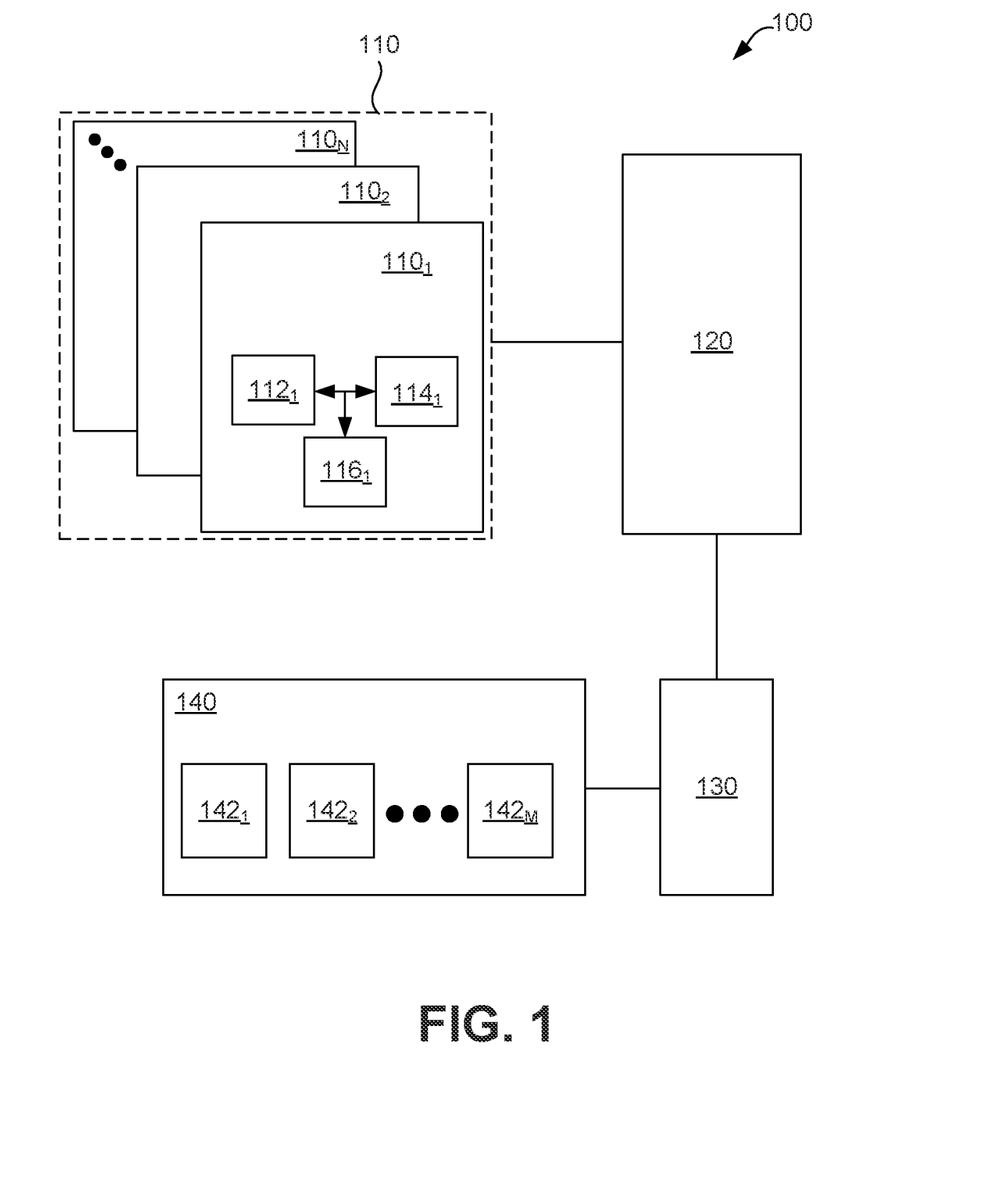
FIG. 1 illustrates a block diagram of a processing system, according to one or more examples.

FIG. 1 illustrates a block diagram of a processing system 100, according to one or more examples. In one or more examples, the processing system 100 is configured similar to the computer system 400 of FIG. 4. The processing system 100 includes processor 110, arbitration circuitry 120, interconnect 130, and memory 140. In one example, the processor 110 is configured similar to the processing device 402 of FIG. 4. In one example, the processor 110 is a vector processor. In other examples, the processor 110 is another type of array processor. The processors 110 include processor slices (or elements) $110_1$-$110_N$, where N is greater than one. In one or more examples, N is $2^O$, where O is one or more.

The processor slices $110_1$-$110_N$ execute instruction sets that operate on arrays of data. In one example, the processor slices $110_1$-$110_N$ execute instruction sets that operate on one-dimensional arrays (e.g., vectors) of data. In one or more examples, the processor slices $110_1$-$110_N$ pipeline execution of the instructions and data operation. The pipeline may include one or more fetching (e.g., loading) stages, execution stages, and data access stages. The processor slices $110_1$-$110_N$ execute memory transactions (e.g., load or store instructions). Load instructions (e.g., memory read or gather instructions) are used to read data from a target address or address of a memory (e.g., the memory 140) and place the data in an indicated register of the processor slice. In one example, a load instruction is a gather instruction that is used to load multiple elements (e.g., a vector of elements) at a time. Write instructions (e.g., store or scatter instructions) are used to write data from a register of the vector slice to a target address of a memory (e.g., the memory 140). In one example, a write instruction is a scatter instruction that writes (e.g., stores) multiple elements (e.g., a vector of elements) at a time. Throughout the following description, when load instruction is used, the load instruction may load a single element or the load instruction may be a gather instruction that loads multiple elements. Further, throughout the following description, when store instruction is used, the store instruction may write a single element or the store instruction may be a scatter instruction that writes multiple elements. In one or more examples, each of the processor slices $110_1$-$110_N$ include various components of a processor pipeline to execute instructions.

In one example, each of the processor slices $110_1$-$110_N$ includes a register file 112, and the functional logic circuits 114 and 116. In one example, the functional logic circuit 116 is omitted such that each of the processor slices $110_1$-$110_N$ include one functional logic circuit (e.g., the functional logic circuit 114). The processor slice $110_1$ includes the register file $112_1$, and the functional logic circuits 1141 and 1161. Further, the processor slice $110_N$ includes the register file $112_N$, and the functional logic circuits $114_N$ and $1116_N$. In one example, the functional logic circuits 114 and 116 include multiplier circuits, floating point circuits, and/or arithmetic logic unit circuits, among others. The register file 112 stores data operated on and modified by the functional logic circuits 114 and 116.

In one example, each of the register files 112 is a slice (e.g., portion) of a primary register file. In such an example, each of the register files 112 includes L bits of the primary register file. The primary register file includes N*L bits. In one example, the bits of the primary register file are divided equally among the register files 112. In an example where the primary register file includes 512 bits, and the number of register files 112 is 16, each of the register files includes 32 bits. In such an example, the register file $112_1$ includes bits 0-31 of the primary register file, the register files $112_2$ includes bits 32-63, and the register file $112_N$ includes bits 479-511 of the primary register file. In other examples, the primary register file includes 16, 32, 64, 128, 256, 1024, or more bits.

The processor slices $110_1$-$110_N$ are connected to the memory 140 via arbitration circuitry 120 and interconnect 130. The interconnect 130 is a communication bus, a crossbar, or other interconnection circuit able to handle distribution of transactions and data from the processor slices $110_1$-$110_N$ to the memory 140. In one example, the interconnect 130 is configured similar to the bus 430 of FIG. 4. In one or more examples, the interconnect 130 communicates transactions of the processor slices $110_1$-$110_N$ received from the arbitration circuitry 120 to the memory 140.

In one or more examples, two or more of the processor slices $110_1$-$110_N$ are able to perform operations on different data sets (e.g., data associated with respective ones of the registers $112_1$-$112_N$) during at least partially overlapping periods. In one or more examples, the at least partially overlapping periods may be referred to being parallel with each other. The periods corresponding to processor cycles. A processor cycle corresponds to the rising or falling edge of a control signal (or signals) of the processor 110 and/or the processor slices $110_1$-$110_N$.

The memory 140 is a volatile or non-volatile memory. In one example, the memory 140 is a cache memory. In one example, the memory 140 is configured similar to that of the main memory 404 of FIG. 4 or the machine-readable storage medium 424 of FIG. 4. In another example, the memory 140 has one or more memory banks $142_1$-$142_M$. M is greater than one. In one example, M is $2^P$, where P is one or more. Each of the memory banks 142 is accessible by the processor slices $110_1$-$110_N$ via the arbitration circuitry 120 and the interconnect 130. The memory banks 142 are segments of the memory 140 that are each individually accessible by the processor slices $110_1$-$110_N$. Each of the memory banks 142 are able to receive or transmit data during a processor cycle.

Each of the memory banks $142_1$-$142_M$ has a width of one or more bytes (e.g., 4 bytes or 32 bits). Further, each of the memory banks $142_1$-$142_M$ has a corresponding address, or bank number.

Two or more of the processor slices $110_1$-$110_N$ execute instructions to store (e.g., transfer or write) data to the memory banks 142 or load (e.g., read) data from the memory banks 142 during processor cycles. In one or more examples, two or more of the processor slices $110_1$-$110_N$ execute a respective instruction to read (e.g., load instruction) or write data (e.g., store instruction) to the same one of the memory banks 142 (e.g., memory bank $142_1$). The target address of the instruction (e.g., memory transaction) includes a number of bits that indicates the memory bank 142 that is to be accessed.

In one or more examples, when two or more of the processor slices $110_1$-$110_N$ attempt to access the same one of the memory banks 142 during a common processor cycle, the memory transactions are determined to be conflicting by the arbitration circuitry 120, and the arbitration circuitry 120 selects one of the memory transactions to issue. In one example, the arbitration circuitry 120 selects a memory transaction based on priority information associated with the processor slices $110_1$-$110_N$. Each of the processor slices $110_1$-$110_N$ is associated with a different priority. In one example, the processor slice $110_1$ has a higher priority than that of the processor slice $110_N$. Accordingly, for conflicting memory transactions, the memory transaction associated with the processor slice $110_1$ is selected before the memory transaction of the processor slice $110_N$ during a common processor cycle. The priority of the processor slices $110_1$-$110_N$ is predefined. In one example, the priority of the processor slices $110_1$-$110_N$ decreases from the processor slice $110_1$ to the processor slice $110_N$, such that the processor slice $110_1$ has a higher priority than that of the processor slice $110_2$, and the processor slice $110_2$ has a higher priority than the processor slice $110_3$, etc. In other examples, the order of priority may differ from that described above such that the priority decreases from the processor slice $110_N$ to the processor slice $110_1$, or other orders of priority between the processor slices $110_1$-$110_N$ may be used.

Figure 2:
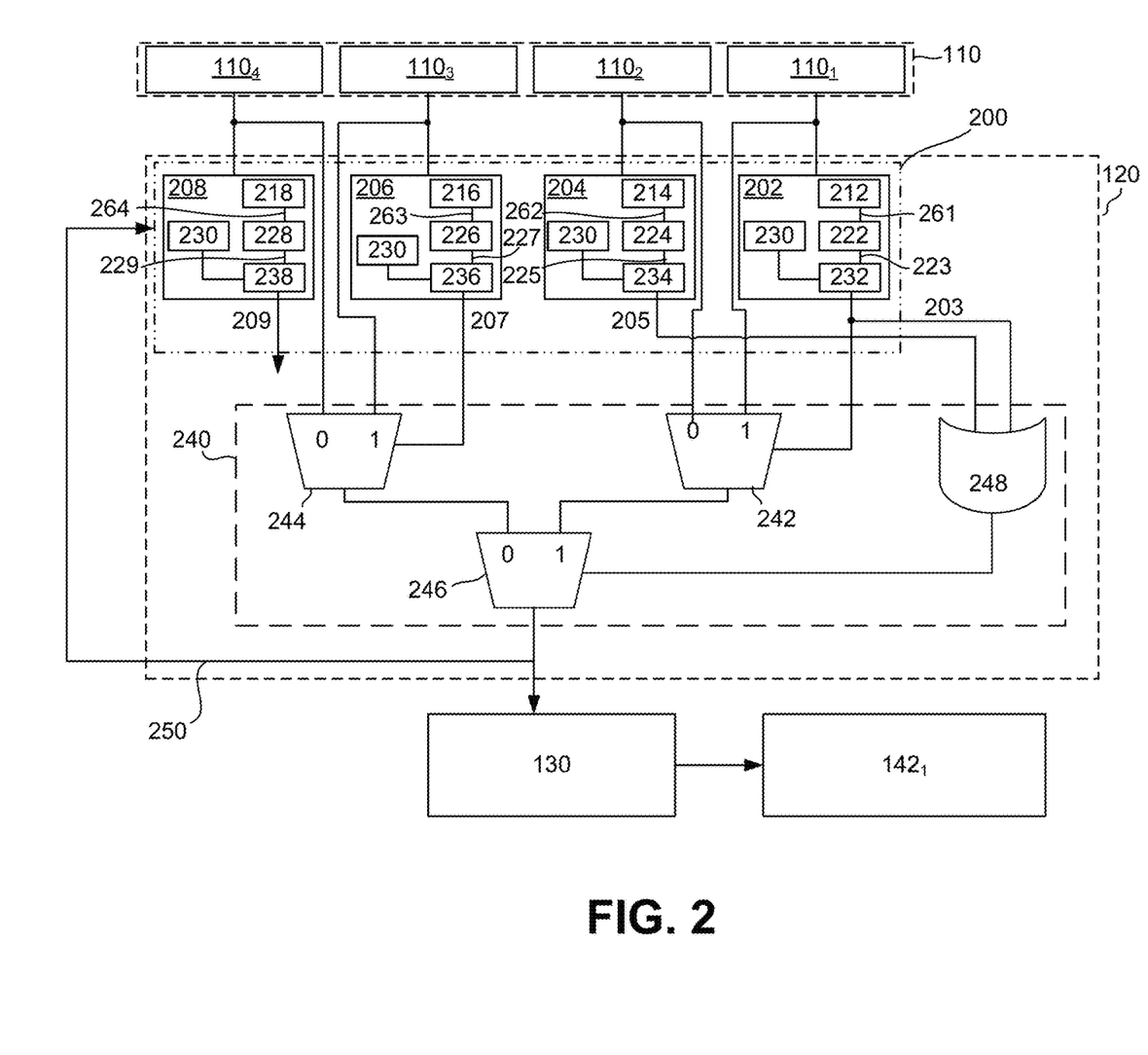
FIG. 2 illustrates a block diagram of an example arbitration circuitry, according to one or more examples.

FIG. 2 illustrates an example block diagram of the arbitration circuitry 120. As illustrated in FIG. 2, the arbitration circuitry 120 is connected to the processor slices $110_1$-$110_4$. The arbitration circuitry 120 selects a memory transaction received from the processor slices $110_1$-$110_4$ based on the priority of processor slices $110_1$-$110_4$ to output to the memory bank $142_1$ via the interconnect 130.

Each of the processor slices $110_1$-$110_4$ outputs a memory transaction (e.g., a load instruction or a store instruction). In one example, a store instruction includes at least a target address, write mask, data, and a validity indication (e.g., predicate) of a respective processor slices $110_1$-$110_4$. A load instruction includes at least a target address, and a validity indication of a processor slices $110_1$-$110_4$. Further, the instruction may be 32 or 64 bits. In other examples, instructions of more than or less than 32 bit or 64 bits may be used. The target address indicates a respective one of the memory banks 142 that is to be written to or read from, and an address within the memory bank. A first one or more bits of the target address indicate the memory bank to be read from or written to, and a second one or more bits indicate the address within the memory bank (e.g., the memory bank $141_1$). In one example, for a store instruction, one or more bits of a target address are used to select the data to be written. For example, the one or more bits of the target address indicate whether the instruction is a 16 bit (2 bytes) or 32 bit (e.g., 4 byte) instruction.

The arbitration circuitry 120 includes control signal generation circuitry 200 and selection circuitry 240. The control signal generation circuitry 200 receives the memory transaction from each of the processor slices $110_1$-$110_4$ and outputs one or more control signals. In one example, the control signal generation circuitry 200 includes detection circuitry 202, detection circuitry 204, detection circuitry 206, and detection circuitry 208. Each detection circuitry 202-208 is connected to a respective one of the processor slices $110_1$-$110_4$. While FIG. 2 illustrates four processor slices $110_1$-$110_4$, in other examples, the number of processor slices is greater or less than four, with a corresponding number of detection circuitries 202-208.

The detection circuitry 202 is connected to the processor slice $110_1$, and receives the memory transaction from the processor slice $110_1$. The memory transaction is a load instruction or a store instruction. The detection circuitry 202 determines whether or not the processor slice $110_1$ is valid (e.g., active for the current processor cycle) based on the corresponding validity indication and whether the target address of the memory transaction of the processor slice $110_1$ matches that of the memory bank $142_1$.

The detection circuitry 202 includes parameter generation circuitry 212, concatenation circuitry 222, and comparison circuitry 232. The parameter generation circuitry 212 generates address information, an identifier, and validity bit 261 for the processor slice $110_1$ from the corresponding memory transaction. The address information indicates the target memory bank. The identifier is unique to each processor slice $110_1$-$110_4$ and used to identify the processor slices $110_1$-$110_4$ from each other. In one example, the identifier includes a number of bits such that each processor slice $110_1$-$110_4$ is associated with a unique identifier. The validity bit indicates whether or not the processor slice $110_1$ is valid (e.g., active) for the current processor cycle. The validity bit is determined from the validity indication associated with the processor slice $110_1$. The validity bit indicates whether or not a respective processor slice $110_1$-$110_4$ has a valid memory transaction. A value of 0 (e.g., 1'b0) indicates that the validity bit is invalid and a value of 1 (e.g., 1'b1) indicates that the validity bit is valid. In one example, if the memory transaction for a processor slice has already been selected by the arbitration circuitry 120 for a processor cycle, the validity bit for that processor slice is set to an invalid value (e.g., a value of 0 or 1'b0) during the following processor cycle.

The concatenation circuitry 222 receives the address information and the validity bit from the parameter generation circuitry 212 and generates a concatenated value (e.g., concatenated signal) 223. The concatenated value 223 includes the address of the target memory bank (e.g., the target memory bank of the memory transaction of the processor slice $110_1$) and the validity bit of the processor slice $110_1$. In one example, the concatenated value 233 is a memory bank value that represents a combination of the corresponding address and the value of the validity bit. In one example, the concatenated value 223 has three bits. The first two bits are associated with the target memory bank of the memory transaction of the processor slice $110_1$ and the last bit is the validity bit. For the processor slice $110_1$, the address of the target memory bank is 01 and the validity bit is 1, accordingly the concatenated value 223 is 011. The address of the target memory bank and the validity bit may be combined together or associated with each other in any combination, without deviating from the scope of the present disclosure.

The comparison circuitry 232 receives the concatenated value 223 and the memory bank concatenated value 230, and compares the memory bank concatenated value 230 with the concatenated value 223 to determine whether or not the concatenated value 223 matches the memory bank concatenated value 230. The memory bank concatenated value 230 is a combination of the address of the memory bank and the validity bit of a value of 1. In one example, the address of the memory bank $142_1$ is 01. Accordingly, the concatenated value 230 of the address of the memory bank $142_1$ and the validity bit value of 1 is 011. In one example, the memory bank concatenated value 230 is a memory bank value that represents a combination of the corresponding address and validity bit being set. As the concatenated value 223 matches the concatenated value 230, the memory transaction for the processor slice $110_1$ is intended for the memory bank $142_1$, and the comparison circuitry 232 outputs the signal 203 having a value of 1.

The detection circuitry 204 includes parameter generation circuitry 214, concatenation circuitry 224, and comparison circuitry 234. The parameter generation circuitry 214 generates address information, an identifier, and validity bit 262 for the processor slice $110_2$ from the corresponding memory transaction.

The concatenation circuitry 224 receives the address information and the validity bit from the parameter generation circuitry 214 and generates a concatenated value 225. The concatenated value 225 includes the address of the target memory bank (e.g., the target memory bank of the memory transaction of the processor slice $110_2$) and the validity bit of the processor slice $110_2$. In one example, the concatenated value 225 has three bits. The first two bits are associated with the target memory bank of the instruction of the processor slice $110_2$ and the last bit is the validity bit. For the processor slice $110_2$, the address of the target memory bank is 01 and the validity bit is 1, accordingly the concatenated value 225 is 011. The first portion of the concatenated value 225 is a memory bank field, and the second portion is a validity bit field. The size of the memory bank field corresponds to the number of memory banks. For example, where the number of memory banks 142 is four, the memory bank field includes two bits. In an example where the number of memory banks 142 is 32, the memory bank field includes six bits.

The comparison circuitry 234 receives the concatenated value 225 and the memory bank concatenated value 230, and compares the memory bank concatenated value 230 with the concatenated value 225 to determine whether or not the concatenated value 225 matches the memory bank concatenated value 230. As the concatenated value 225 matches the concatenated value 230, the comparison circuitry 234 outputs the signal 205 having a value of 1, an indication that the memory transaction of the processor slice $110_2$ has a target address associated with the memory bank $142_1$.

The detection circuitry 206 includes parameter generation circuitry 216, concatenation circuitry 226, and comparison circuitry 236. The parameter generation circuitry 216 generates address information, an identifier, and validity bit 263 for the processor slice $110_3$ from the corresponding memory transaction.

The concatenation circuitry 226 receives the address information and the validity bit from the parameter generation circuitry 216 and generates a concatenated value 227. The concatenated value 227 includes the address of the target memory bank (e.g., the target memory bank of the memory transaction of the processor slice $110_3$) and the validity bit of the processor slice $110_3$. In one example, the concatenated value 227 has three bits. The first two bits are associated with the target memory bank of the instruction of the processor slice $110_3$ and the last bit is the validity bit. For the processor slice $110_3$, the address of the target memory bank is 10 and the validity bit is 1, accordingly the concatenated value 227 is 101.

The comparison circuitry 236 receives the concatenated value 227 and the memory bank concatenated value 230, and compares the memory bank concatenated value 230 with the concatenated value 227 to determine whether or not the concatenated value 227 matches the memory bank concatenated value 230. As the concatenated value 227 does not match the concatenated value 230 (e.g., 101 does not equal 011), the comparison circuitry 236 outputs the signal 207 having a value of 0, an indication that the memory transaction of the processor slice $110_3$ has a target address different from that of the memory bank $142_1$.

The detection circuitry 208 includes parameter generation circuitry 218, concatenation circuitry 228, and comparison circuitry 238. The parameter generation circuitry 218 generates address information, an identifier, and validity bit 264 for the processor slice $110_4$ from the corresponding memory transaction.

The concatenation circuitry 228 receives the address information and the validity bit from the parameter generation circuitry 218 and generates a concatenated value 229. The concatenated value 229 includes the address of the target memory bank (e.g., the target memory bank of the memory transaction of the processor slice $110_4$) and the validity bit of the processor slice $110_4$. In one example, the concatenated value 229 has three bits. The first two bits are associated with the target memory bank of the instruction of the processor slice $110_4$ and the last bit is the validity bit. For the processor slice $110_4$, the address of the target memory bank is 11 and the validity bit is 1, accordingly the concatenated value 229 is 111.

The comparison circuitry 238 receives the concatenated value 229 and the memory bank concatenated value 230, and compares the memory bank concatenated value 230 with the concatenated value 229 to determine whether or not the concatenated value 229 matches the memory bank concatenated value 230. As the concatenated value 229 does not match the concatenated value 230 (e.g., 111 does not equal 011), the comparison circuitry 238 outputs the signal 209 having a value of logic 0, an indication that the memory transaction of the processor slice $110_4$ has a target address different from that of the memory bank $142_1$.

In one example, the detection circuitry 208 may be omitted. In such an example, the number of detection circuitries is less than the number of processor slices.

As the signal 203 and 205 both have a value of 1, there is a conflict between the memory transactions associated with the processor slices $110_1$ and $110_2$. The arbitration circuitry 120 further includes selection circuitry 240 to select between the memory transactions. The selection circuitry 240 includes one or more multiplexers (e.g., multiplexers 242, 244, and 246) and one or more logic gates (e.g., the OR gate 248). The multiplexers 242, 244, and 246 are disposed in a number of rows. For example, the multiplexers 242 and 244 are disposed in a first row and the multiplexer 246 is disposed in a second row. The number of multiplexers and the number of rows vary based on the number of the processor slices $110_1$-$110_N$ connected to the arbitration circuitry 120. In the example of FIG. 2, for four processor slices (e.g., processor slices $110_1$-$110_4$), two rows of multiplexers are used to select an output of one of the processor slices $110_1$-$110_4$. In an example where there are 32 processor slices $110_1$-$110_N$ connected to the arbitration circuitry 120, five rows of multiplexers are used to select an output of one of the processor slices $110_1$-$110_N$. Further, the number of multiplexers, and the number of rows of the multiplexers, increases as the number of processor slices increases. In one example, the number of multiplexer rows is equal to $\log_2$ (slices). For example, for 4 slices, there are 2 rows. Further, for 8 slices there are 3 rows, for 16 slices there are 4 rows, and for 32 slices there are 5 rows.

In one example, the multiplexer 242 has two inputs, an input 0 and input 1. The input 1 is connected to and receives the memory transaction from the processor slice $110_1$. The input 0 is connected to and receives the memory transaction from the processor slice $110_2$. Further, the multiplexer 242 is connected to and receives the output of the comparison circuitry 232 as a control signal. In one example, based on the control signal having a value of logic 0, the multiplexer 242 selects the signal connected to input 0 to output. Further, based on the control signal having a value of logic 1, the multiplexer 242 selects the signal connected to the input 1 to output. As described above, since the signal 203 has a value of logic 1, the multiplexer 242 selects and outputs the memory transaction of processor slice $110_1$ connected to the input 1.

The multiplexer 244 has two inputs, an input 0 and input 1. The input 1 is connected to and receives the memory transaction from the processor slice $110_3$. The input 0 is connected to and receives the instruction from the processor slice $110_4$. Further, the multiplexer 244 is connected to and receives the signal 207 output by the comparison circuitry 236 as a control signal. In one example, based on the signal 207 having a value of logic 0, the multiplexer 244 selects and outputs the memory transaction output by the processor slice $110_4$, and based on the signal 207 having a value of logic 1, the multiplexer 244 selects and outputs the memory transaction output by the processor slice $110_3$.

The multiplexer 246 has an input 0 and input 1. The input 1 is connected to the output of the multiplexer 242 and the input 0 is connected to the output of the multiplexer 244. Further, the multiplexer 246 receives the output of the OR gate 248 as a control signal. The OR gate 248 receives the signal 203 and the signal 205. In one example, the OR gate 248 outputs a signal having a value of logic 1 based on either of the signals 203 and 205 having a value of logic 1. If the signals 203 and 205 output by both the comparison circuitry 232 and the comparison circuitry 234 have a value of 0, the signal output the OR gate 248 has a value of 0.

In one example, the signals 205 and 203 have a value of 1, accordingly, the output of the OR gate 248 has a value of logic 1, and the multiplexer 246 selects and outputs the output of the multiplexer 242. Accordingly, the memory transaction of the processor slice $110_1$ is selected and output by the arbitration circuitry 120 during a first processor cycle.

Based on the memory transaction of the processor slice $110_1$ being output by the arbitration circuitry 120, the arbitration circuitry 120 updates the respective validity bit of the processor slice $110_1$ to have a value of 0, such that the validity state of the processor slice $110_1$ is invalid during the next processor cycle. Accordingly, during the next processor cycle, the memory transaction of the processor slice $110_1$ is not selected by the arbitration circuitry 120.

The arbitration circuitry 120 matches the identifier of the selected memory transaction, and with that of the processor slices $110_1$-$110_4$ to update the validity bit of the selected processor slices $110_1$-$110_4$. In one example, the control signal generation circuitry 200 receives the identifier via the path 250. The control signal generation circuitry 200 determines which of the processor slices $110_1$-$110_N$ is associated with the selected memory transaction, and updates the validity bit of the associated processor slice $110_1$-$110_N$ to have a value of 0. Accordingly, the processor slice $110_1$-$110_N$ associated the selected memory transaction is not selected during a subsequent cycle. In one or more examples, as the memory transaction for each of the processor slices $110_1$-$110_4$ is selected and output by the arbitration circuitry 120, the validity bits for each respective selected processor slice is set to a value of 0, such that the output from the next processor slice associated with a conflicting memory transaction is selected and output during a following processor cycle.

In one example, the parameter generation circuitries 212, 214, 216, and 218 generate the address information and validity bit, without generating the identifier. Accordingly, the arbitration circuitry 120 updates the validity bit of the processor slice $110_1$-$110_4$ associated with the selected and output memory transaction.

In one or more examples, the arbitration circuitry 120 includes control signal generation circuitry 200 and selection circuitry 240 for each one of the memory banks 142. The control signal generation circuitry 200 and selection circuitry 240 for each memory bank functions similar to that as described above with regard to FIG. 2. In one example, during each processor cycle, each of the control signal generation circuitries 200 receives the memory transactions from the processor slices $110_1$-$110_N$, generates control signals to output as is described above in FIG. 2.

In the example of FIG. 2, the priority of the processor slices $110_1$-$110_4$, decreases from the processor slice $110_1$ to the processor slice $110_4$. However, in an example where the priority is different than that, the configuration of the signals 203, 205, 207, and 209 as control signals for the multiplexers 242-246 may differ from that illustrated in FIG. 2. For example, if the processor slice $110_2$ has a higher priority than that of the processor slice $110_1$, the signal 205 is used as the control signal for the multiplexer 242 instead of the signal 203. Further, in an example where the processor slice $110_4$ has a higher priority than that of the processor slice $110_3$, the signal 209 is used as the control signal for the multiplexer 244. Further, in an example where the processor slices $110_3$ and $110_4$ have a higher priority than that of the processor slices $110_1$ and $110_2$, the signals 207 and 209 are used to generate a control signal for the multiplexer 246 allows the multiplexer 246 to select the memory transaction associated with the highest priority processor slice.

Figure 3:
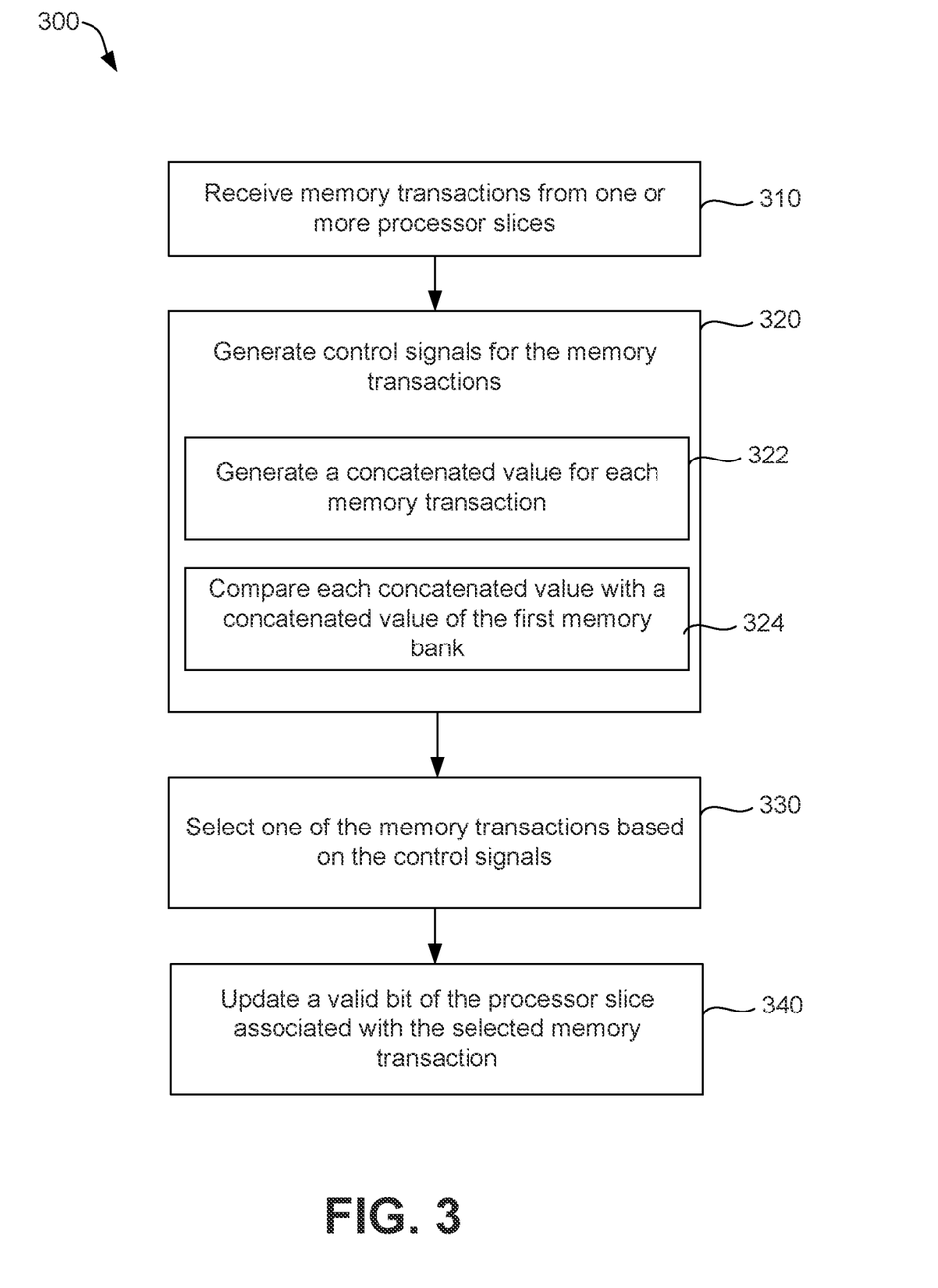
FIG. 3 illustrates a flowchart of a method for selecting between memory transactions, according to one or more examples.

FIG. 3 illustrates a flowchart of a method 300 for selecting a transaction, according to one or more examples. The method 300 is performed by the arbitration circuitry 120 of FIG. 2. At 310, memory transactions are received from one or more processor slices. For example, with reference to FIG. 2, the control signal generation circuitry 200 receives the memory transactions from the processor slices $110_1$-$110_4$ during a processor cycle. In one example, during a processor cycle, each of the detection circuitries 202, 204, 206, and 208 receives a memory transaction from a respective one of the processor slices $110_1$-$110_4$ and generates respective address information and sets a value of a respective value bit as described above with regard to FIG. 2.

At 320, control signals for the memory transactions are generated. The control signals are generated from respective address information and validity bit for each memory transaction, and are used to determine whether or not a memory transaction is associated with (e.g., has a target address of) the first memory bank. With reference to FIG. 2, the arbitration circuitry 120 generates the control signals based on a determination as to whether or not the memory transactions of the processor slices $110_1$-$110_N$ are associated with the memory bank $142_1$. In one example, generating the control signals includes, at 322, generating concatenated values for each of the memory transactions and respective processor slice. For example, the detection circuitries 202, 204, 206, and 208 generate concatenated values 223, 225, 227, and 229 based on the address information and validity bits of each respective memory transaction and processor slice as described above. Further, generating the control signals includes, at 324, comparing the concatenated values for each memory transaction to a concatenated value of a memory bank. Comparing the concatenated values with the concatenated value of the memory bank determines whether or not a corresponding memory transaction has the target address of the memory bank. In one example, the concatenated values 223, 225, 227, and 229 are compared to a concatenated value of the memory bank 142$_1$. The detection circuitries 202, 204, 206, and 208 generate control signals (e.g., signals 203, 205, and 207) based on a comparison of the concatenated values 223, 225, 227, and 229 and the memory bank concatenated value 230 for the memory bank 142$_1$. The values of the signals 203, 205, and 207 indicate whether or not the respective memory transaction is associated with the memory bank 142$_1$. For example, a value of one indicates that the respective memory transaction has a target address within the memory bank 142$_1$, and a value of zero indicates that the respective memory transaction has a target address not within the memory bank 142$_1$. In one example, other values may be used to indicate whether or not a memory transaction has a target address within the memory bank 142$_1$.

At 330, one of the memory transactions is selected based on the control signals. For example, with reference to FIG. 2, the arbitration circuitry 120 of FIG. 2 selects a memory transaction of the processor slices 110$_1$-110$_4$ based on the control signals. In one example, the control signals correspond to a priority of the processor slices 110$_1$-110$_4$. As is described above with regard to FIG. 2, the arbitration circuitry 120 includes the selection circuitry 240 that includes one or more multiplexers 242-246 and gate logic (e.g., or gate 248) that select the memory transactions of the processor slices 110$_1$-110$_4$ based on the signals 203, 205, and 207 (e.g., control signals). The signals 203, 205, and 207 function as, or are used to generate, the control signals for the multiplexers 242-246. Using the signals 203, 205, and 207 as, or to generate, the control signals for the multiplexers 242-246, controls the multiplexers 242-246 to select one of the memory transactions having a target address within the memory bank 142$_1$ based on the priority of the processor slices 110$_1$-110$_4$. As is illustrated in FIG. 2, the multiplexers 242-246 are disposed in multiple rows, with the multiplexers 242 and 244 feeding into the multiplexers 246. An OR gate is used to generate a control signal for the multiplexers 246 from the signals 203 and 205. The signal 203 functions as the control signal of the multiplexer 242, and the signal 207 functions as the control signal of the multiplexer 244. The configuration of the multiplexers 242-246 with regard to each other, and the use of the signals 203-207 as control signals, or to generate control signals allows for the highest priority memory transaction to be selected and output. For example, if both the signals 203 and 205 have a value of one, indicating that the memory transactions associated with the processor slices 110$_1$ and 110$_2$ have a target address within the memory bank 142$_1$, the multiplexer 242 selects the memory transaction associated with the processor slice 110$_1$ based on the signal 203. As the processor slice 110$_1$ has a higher priority than that of the processor slice 110$_2$, the multiplexer 242 selects the memory transaction associated with the highest priority processor slice. In one example, if the processor slice 110$_2$ has a higher priority than that of the processor slice 110$_1$, the signal 205 is used as the control signal for the multiplexer 242 instead of the signal 203. Further, as the control signal for the multiplexer 244 is the signal 207, the multiplexer 244 selects a memory transaction from the processor slice 110$_3$ or 110$_4$, based on the priority of the processor slices 110$_3$ and 110$_4$. The configuration of FIG. 2 illustrates an example where the processor slice 110$_3$ has a higher priority than that of the processor slice 110$_4$. In an example where the processor slice 110$_4$ has a higher priority than that of the processor slice 110$_3$, the signal 209 is used as the control signal for the multiplexer 244. Further, in an example where the processor slices 110$_1$ and 110$_2$ have a higher priority than that of the processor slices 110$_3$ and 110$_4$, using the signals 203 and 205 to generate a control signal for the multiplexer 246 allows the multiplexer 246 to select the memory transaction associated with the highest priority processor slice.

The selected transaction is output to the respective memory bank (e.g., memory bank 142$_1$) via the interconnect 130.

At 340, the validity bit of the processor associated with the selected transaction is set to 0. For example, with reference to FIG. 2, the arbitration circuitry 120 updates the validity bit of the processor slice 110$_1$-110$_4$ associated with the selected transaction to a value of 0. The method 300 then returns 320, and performs 320-340 for a subsequent processor cycle. In one example, each of 320-340 are performed during a common processor cycle. During each processor cycle a different memory transaction is selected and output. In one example, the method 300 is performed until each of the received instructions that is associated with the first memory bank are selected and output.

Figure 4:
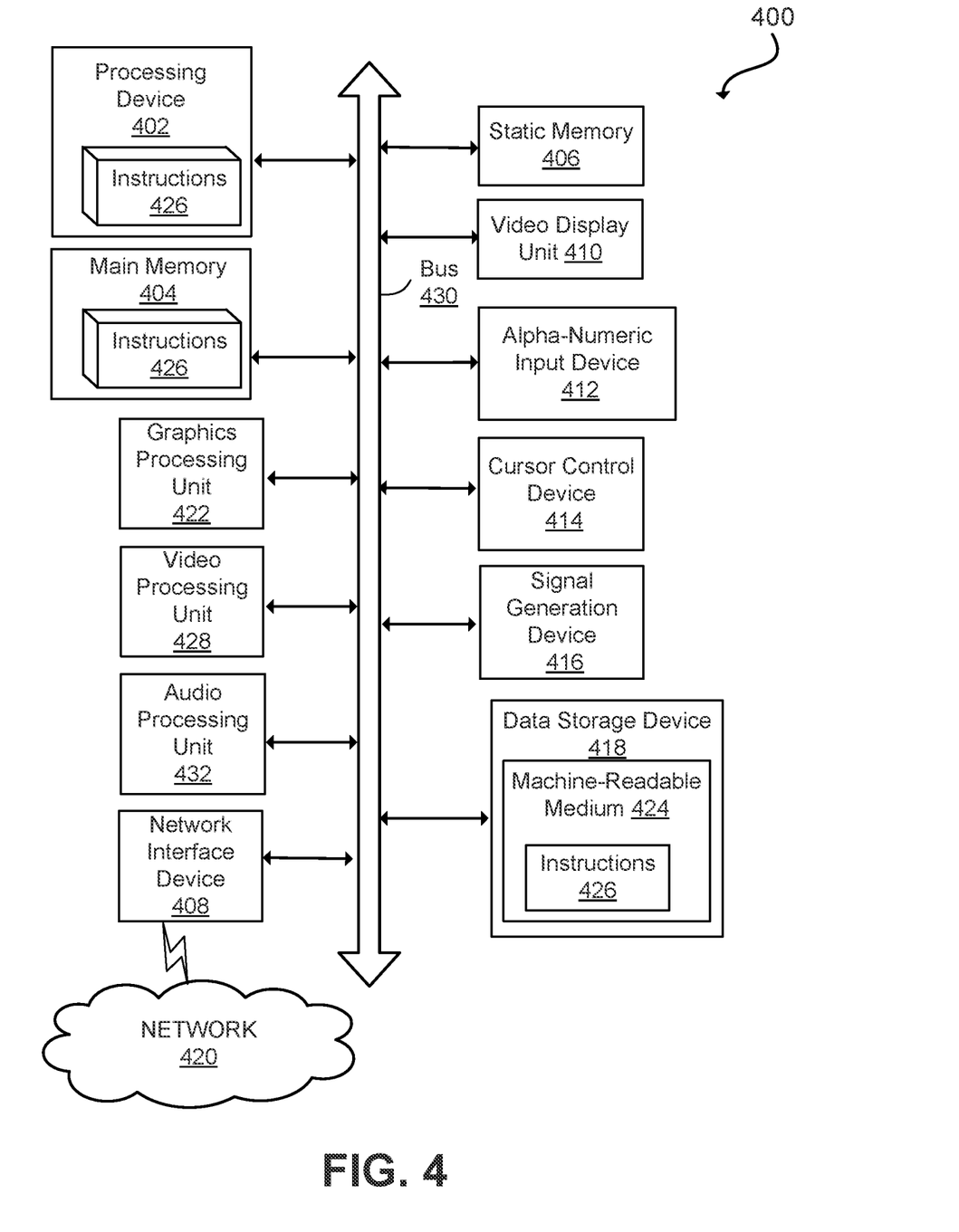
FIG. 4 depicts a diagram of an example computer system in which embodiments of the present disclosure may operate.

FIG. 4 illustrates an example machine of a computer system 400 within which a set of instructions, for causing the machine to perform any one or more of the methodologies discussed herein, may be executed. In alternative implementations, the machine may be connected (e.g., networked) to other machines in a LAN, an intranet, an extranet, and/or the Internet. The machine may operate in the capacity of a server or a client machine in client-server network environment, as a peer machine in a peer-to-peer (or distributed) network environment, or as a server or a client machine in a cloud computing infrastructure or environment.

The machine may be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 400 includes a processing device 402, a main memory 404 (e.g., read-only memory (ROM), flash memory, dynamic random access memory (DRAM) such as synchronous DRAM (SDRAM), a static memory 406 (e.g., flash memory, static random access memory (SRAM), etc.), and a data storage device 418, which communicate with each other via a bus 430.

Processing device 402 represents one or more processors such as a microprocessor, a central processing unit, or the like. More particularly, the processing device may be complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 402 may also be one or more special-purpose processing devices such as an application specific integrated circuit (ASIC), a field programmable gate array (FPGA), a digital signal processor (DSP), network processor, or the like. The processing device 402 may be configured to execute instructions 426 for performing the operations and steps described herein.

The computer system 400 may further include a network interface device 408 to communicate over the network 420. The computer system 400 also may include a video display unit 410 (e.g., a liquid crystal display (LCD) or a cathode ray tube (CRT)), an alphanumeric input device 412 (e.g., a keyboard), a cursor control device 414 (e.g., a mouse), a graphics processing unit 422, a signal generation device 416 (e.g., a speaker), graphics processing unit 422, video processing unit 428, and audio processing unit 432.

The data storage device 418 may include a machine-readable storage medium 424 (also known as a non-transitory computer-readable medium) on which is stored one or more sets of instructions 426 or software embodying any one or more of the methodologies or functions described herein. The instructions 426 may also reside, completely or at least partially, within the main memory 404 and/or within the processing device 402 during execution thereof by the computer system 400, the main memory 404 and the processing device 402 also constituting machine-readable storage media.

In some implementations, the instructions 426 include instructions to implement functionality corresponding to the present disclosure. While the machine-readable storage medium 424 is shown in an example implementation to be a single medium, the term "machine-readable storage medium" should be taken to include a single medium or multiple media (e.g., a centralized or distributed database, and/or associated caches and servers) that store the one or more sets of instructions. The term "machine-readable storage medium" shall also be taken to include any medium that is capable of storing or encoding a set of instructions for execution by the machine and that cause the machine and the processing device 402 to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm may be a sequence of operations leading to a desired result. The operations are those requiring physical manipulations of physical quantities. Such quantities may take the form of electrical or magnetic signals capable of being stored, combined, compared, and otherwise manipulated. Such signals may be referred to as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the present disclosure, it is appreciated that throughout the description, certain terms refer to the action and processes of a computer system, or similar electronic computing device, that manipulates and transforms data represented as physical (electronic) quantities within the computer system's registers and memories into other data similarly represented as physical quantities within the computer system memories or registers or other such information storage devices.

The present disclosure also relates to an apparatus for performing the operations herein. This apparatus may be specially constructed for the intended purposes, or it may include a computer selectively activated or reconfigured by a computer program stored in the computer. Such a computer program may be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various other systems may be used with programs in accordance with the teachings herein, or it may prove convenient to construct a more specialized apparatus to perform the method. In addition, the present disclosure is not described with reference to any particular programming language. It will be appreciated that a variety of programming languages may be used to implement the teachings of the disclosure as described herein.

The present disclosure may be provided as a computer program product, or software, that may include a machine-readable medium having stored thereon instructions, which may be used to program a computer system (or other electronic devices) to perform a process according to the present disclosure. A machine-readable medium includes any mechanism for storing information in a form readable by a machine (e.g., a computer). For example, a machine-readable (e.g., computer-readable) medium includes a machine (e.g., a computer) readable storage medium such as a read only memory ("ROM"), random access memory ("RAM"), magnetic disk storage media, optical storage media, flash memory devices, etc.

In the foregoing disclosure, implementations of the disclosure have been described with reference to specific example implementations thereof. It will be evident that various modifications may be made thereto without departing from the broader spirit and scope of implementations of the disclosure as set forth in the following claims. Where the disclosure refers to some elements in the singular tense, more than one element can be depicted in the figures and like elements are labeled with like numerals. The disclosure and drawings are, accordingly, to be regarded in an illustrative sense rather than a restrictive sense.

What is claimed is:

1. A system comprising:
a memory comprising a first memory bank;
a processor comprising a first processor slice and a second processor slice configured to respectively generate a first memory transaction comprising a first target address and a second memory transaction comprising a second target address for the first memory bank; and
arbitration circuitry connected to the processor, the arbitration circuitry:
generates a first control signal for the first memory transaction based on a comparison of the first target address and a first validity bit of the first processor slice with a memory bank value of the first memory bank, and a second control signal for the second memory transaction based on a comparison of the second target address and a second validity bit of the second processor slice with the memory bank value; and selects the first memory transaction to output to the first memory bank based on one or more of the first control signal and the second control signal.

2. The system of claim 1, wherein the arbitration circuitry is further configured to:
generate a first value based on the first target address and the first validity bit; and
compare the first value with the memory bank value to determine that the first memory transaction is associated with the first memory bank.

3. The system of claim 2, wherein the arbitration circuitry is further configured to:
generate the first control signal based on the comparison of the first value and the memory bank value.

4. The system of claim 1, wherein the arbitration circuitry is further configured to:
update the first validity bit associated with the first processor slice based on the selected first memory transaction.

5. The system of claim 1, the arbitration circuitry is further configured to:
generate a second value based on the second target address and the second validity bit; and
compare the second value with the memory bank value to generate the second control signal.

6. The system of claim 1, wherein the processor further comprises a third processor slice configured to generate a third memory transaction, and the arbitration circuitry is further configured to:
select the third memory transaction to output to the first memory bank based the first control signal and the second control signal.

7. The system of claim 1, wherein the memory further comprises a second memory bank, and wherein the arbitration circuitry is further configured to select the second memory transaction to output to the second memory bank.

8. The system of claim 1, wherein the arbitration circuitry comprises:
a first multiplexer that outputs a first output signal selected from the first memory transaction and the second memory transaction based on the first control signal; and
a second multiplexer that outputs a second output signal selected from the first output signal and a third memory transaction based on a third control signal, wherein the third memory transaction is associated with a third processor slice of the processor.

9. A method comprising:
receiving a first memory transaction comprising a first target address from a first processor slice of a processor and a second memory transaction comprising a second target address from a second processor slice of the processor;
generating a first control signal for the first memory transaction based on a comparison of the first target address and a first validity bit of the first processor slice with a memory bank value of a first memory bank of a memory, and a second control signal for the second memory transaction based on a comparison of the second target address and a second validity bit of the second processor slice with the memory bank value; and
selecting the first memory transaction to output to the first memory bank based on one or more of the first control signal and the second control signal.

10. The method of claim 9 further comprising:
generating a first value based on the first target address and the first validity bit; and
comparing the first value with the memory bank value to determine that the first memory transaction is associated with the first memory bank.

11. The method of claim 10 further comprising:
generating the first control signal based on the comparison of the first value and the memory bank value.

12. The method of claim 9 further comprising:
updating the first validity bit associated with the first processor slice based on selecting the first memory transaction.

13. The method of claim 9 further comprising:
generating a second value based on the second target address and the second validity bit; and
comparing the second value with the memory bank value to determine that the second memory transaction is associated with the first memory bank and generate the second control signal.

14. The method of claim 9 further comprising:
receiving a third transaction from a third processor slice of the processor; and
selecting the third transaction to output to the first memory bank based the first control signal and the second control signal.

15. The method of claim 9 further comprising selecting the second memory transaction to output to a second memory bank of the memory.

16. The method of claim 9, wherein the first memory transaction is selected during a first cycle, and wherein the method further comprises selecting the second memory transaction to output during a second cycle subsequent to the first cycle.

17. An arbitration circuitry comprising:
control signal generation circuitry configured to:
receive a first memory transaction comprising a first target address from a first processor slice of a processor and a second memory transaction comprising a second target address from a second processor slice of the processor; and
generate a first control signal for the first memory transaction based on a comparison of the first target address and a first validity bit of the first processor slice with a memory bank value of the first memory bank, and a second control signal for the second memory transaction based on a comparison of the second target address and a second validity bit of the second processor slice with the memory bank value; and
selection circuitry configured to:
receive the first memory transaction and the second memory transaction; and
select the first memory transaction to output to the memory bank based on one or more of the first control signal and the second control signal.

18. The arbitration circuitry of claim 17, wherein the control signal generation circuitry comprises:
first detection circuitry configured to:
generate a first value based on the first target address and the first validity bit; and
compare the first value with the memory bank value to determine that the first memory transaction is associated with the first memory bank.

19. The arbitration circuitry of claim 18, wherein the first detection circuitry is further configured to generate the first control signal based on the comparison of the first value and the memory bank value.

20. The arbitration circuitry of claim 17, wherein the arbitration circuitry is further configured to:
    update the first validity bit associated with the first processor slice based on selecting the first memory transaction.

\* \* \* \* \*